(12) United States Patent
Fox et al.

(10) Patent No.: US 7,622,400 B1
(45) Date of Patent: Nov. 24, 2009

(54) METHOD FOR IMPROVING MECHANICAL PROPERTIES OF LOW DIELECTRIC CONSTANT MATERIALS

(75) Inventors: Keith Fox, Portland, OR (US); Easwar Srinivasan, Beaverton, OR (US); David Mordo, Cupertino, CA (US); Qingguo Wu, Tualatin, OR (US)

(73) Assignee: Novellus Systems, Inc., San Jose, CA (US)

( * ) Notice: Subject to any disclaimer, the term of this patent is extended or adjusted under 35 U.S.C. 154(b) by 32 days.

(21) Appl. No.: 10/849,568

(22) Filed: May 18, 2004

(51) Int. Cl.
*H01L 21/31* (2006.01)
*H01L 21/469* (2006.01)

(52) U.S. Cl. .............. 438/784; 438/761; 438/788; 257/E21.276; 257/E21.277

(58) Field of Classification Search ......... 438/774, 438/584, 783, 541, FOR. 448, 788, 761, 778, 438/784; 257/E21.226, E21.275–E21.277, 257/E21.149, E21.3, E21.576
See application file for complete search history.

(56) References Cited

U.S. PATENT DOCUMENTS

| | | | |
|---|---|---|---|
| 4,357,451 A | 11/1982 | McDaniel | |
| 4,882,008 A | 11/1989 | Garza et al. | |
| 4,885,262 A | 12/1989 | Ting et al. | |
| 4,968,384 A * | 11/1990 | Asano | ......... 438/96 |
| 5,281,546 A * | 1/1994 | Possin et al. | ......... 438/158 |
| 5,504,042 A | 4/1996 | Cho et al. | |
| 5,648,175 A * | 7/1997 | Russell et al. | ......... 428/472.3 |
| 5,686,054 A | 11/1997 | Barthel et al. | |
| 5,700,844 A | 12/1997 | Hedrick et al. | |
| 5,789,027 A | 8/1998 | Watkins et al. | |
| 5,849,640 A * | 12/1998 | Hsia et al. | ......... 438/734 |
| 5,851,715 A | 12/1998 | Barthel et al. | |
| 5,858,457 A | 1/1999 | Brinker et al. | |
| 5,920,790 A | 7/1999 | Wetzel et al. | |
| 6,140,252 A | 10/2000 | Cho et al. | |
| 6,149,828 A | 11/2000 | Vaartstra | |
| 6,171,661 B1 * | 1/2001 | Zheng et al. | ......... 427/535 |
| 6,177,329 B1 | 1/2001 | Pang | |
| 6,232,658 B1 | 5/2001 | Catabay et al. | |
| 6,258,735 B1 | 7/2001 | Xia et al. | |
| 6,268,276 B1 | 7/2001 | Chan et al. | |
| 6,268,288 B1 * | 7/2001 | Hautala et al. | ......... 438/680 |

(Continued)

FOREIGN PATENT DOCUMENTS

WO    WO95/07543    3/1995

(Continued)

OTHER PUBLICATIONS

U.S. Office Action mailed Aug. 24, 2005, from U.S. Appl. No. 10/404,693.

(Continued)

*Primary Examiner*—Matthew Smith
*Assistant Examiner*—Quovaunda Jefferson
(74) *Attorney, Agent, or Firm*—Weaver Austin Villeneuve & Sampson LLP

(57) ABSTRACT

Methods of forming a dielectric layer having a low dielectric constant and high mechanical strength are provided. The methods involve depositing a sub-layer of the dielectric material on a substrate, followed by treating the sub-layer with a plasma. The process of depositing and plasma treating the sub-layers is repeated until a desired thickness has been reached.

28 Claims, 6 Drawing Sheets

U.S. PATENT DOCUMENTS

| | | | |
|---|---|---|---|
| 6,270,846 B1 | 8/2001 | Brinker et al. | |
| 6,271,273 B1 | 8/2001 | You et al. | |
| 6,306,564 B1 | 10/2001 | Mullee | |
| 6,312,793 B1 | 11/2001 | Grill et al. | |
| 6,329,017 B1 | 12/2001 | Liu et al. | |
| 6,329,062 B1 | 12/2001 | Gaynor | |
| 6,331,480 B1 | 12/2001 | Tsai et al. | |
| 6,340,628 B1 | 1/2002 | Van Cleemput et al. | |
| 6,365,266 B1 | 4/2002 | MacDougall et al. | |
| 6,365,528 B1 | 4/2002 | Sukharev et al. | |
| 6,383,466 B1 | 5/2002 | Domansky et al. | |
| 6,383,955 B1 | 5/2002 | Matsuki et al. | |
| 6,386,466 B1 | 5/2002 | Ozawa et al. | |
| 6,387,453 B1 | 5/2002 | Brinker et al. | |
| 6,391,932 B1 | 5/2002 | Gore et al. | |
| 6,392,017 B1 | 5/2002 | Chandrashekar | |
| 6,407,013 B1 | 6/2002 | Li et al. | |
| 6,413,583 B1 | 7/2002 | Moghadam et al. | |
| 6,420,441 B1 | 7/2002 | Allen et al. | |
| 6,444,036 B2* | 9/2002 | Chern et al. | 118/697 |
| 6,444,715 B1 | 9/2002 | Mukherjee et al. | |
| 6,455,417 B1* | 9/2002 | Bao et al. | 438/637 |
| 6,479,374 B1 | 11/2002 | Ioka et al. | |
| 6,500,770 B1 | 12/2002 | Cheng et al. | |
| 6,548,113 B1 | 4/2003 | Birnbaum et al. | |
| 6,566,278 B1 | 5/2003 | Harvey et al. | |
| 6,570,256 B2 | 5/2003 | Conti et al. | |
| 6,572,925 B2 | 6/2003 | Zubkov et al. | |
| 6,573,030 B1 | 6/2003 | Fairbairn et al. | |
| 6,576,345 B1 | 6/2003 | Cleemput et al. | |
| 6,596,467 B2 | 7/2003 | Gallagher et al. | |
| 6,596,654 B1 | 7/2003 | Bayman et al. | 438/788 |
| 6,610,362 B1 | 8/2003 | Towle | |
| 6,632,478 B2 | 10/2003 | Gaillard et al. | |
| 6,662,631 B2 | 12/2003 | Baklanov et al. | |
| 6,667,147 B2 | 12/2003 | Gallagher et al. | |
| 6,677,251 B1 | 1/2004 | Lu et al. | |
| 6,677,253 B2 | 1/2004 | Andideh et al. | |
| 6,680,262 B2 | 1/2004 | Andideh et al. | |
| 6,715,498 B1 | 4/2004 | Humayun et al. | |
| 6,734,118 B2 | 5/2004 | Kloster et al. | |
| 6,756,085 B2 | 6/2004 | Waldfried et al. | |
| 6,797,643 B2 | 9/2004 | Rocha-Alvarez et al. | |
| 6,805,801 B1 | 10/2004 | Humayun et al. | |
| 6,812,043 B2* | 11/2004 | Bao et al. | 438/4 |
| 6,815,373 B2 | 11/2004 | Singh et al. | |
| 6,831,284 B2 | 12/2004 | Demos et al. | |
| 6,846,380 B2 | 1/2005 | Dickinson et al. | |
| 6,848,458 B1 | 2/2005 | Shrinivasan et al. | |
| 6,849,549 B1 | 2/2005 | Chiou et al. | |
| 6,867,086 B1 | 3/2005 | Chen et al. | |
| 6,903,004 B1 | 6/2005 | Spencer et al. | |
| 6,914,014 B2 | 7/2005 | Li et al. | |
| 6,943,121 B2 | 9/2005 | Leu et al. | |
| 6,991,959 B2* | 1/2006 | Goundar et al. | 438/105 |
| 7,018,918 B2 | 3/2006 | Kloster et al. | |
| 7,087,271 B2 | 8/2006 | Rhee et al. | |
| 7,094,713 B1 | 8/2006 | Niu et al. | |
| 7,098,149 B2 | 8/2006 | Lukas et al. | |
| 7,176,144 B1 | 2/2007 | Wang et al. | |
| 7,326,444 B1 | 2/2008 | Wu et al. | |
| 7,341,761 B1 | 3/2008 | Wu et al. | |
| 7,381,662 B1 | 6/2008 | Niu et al. | |
| 7,390,537 B1 | 6/2008 | Wu et al. | |
| 2002/0001973 A1 | 1/2002 | Wu et al. | |
| 2002/0016085 A1* | 2/2002 | Huang et al. | 438/798 |
| 2002/0034626 A1 | 3/2002 | Liu et al. | |
| 2002/0064341 A1 | 5/2002 | Fauver et al. | |
| 2002/0076946 A1* | 6/2002 | Kim et al. | 438/785 |
| 2002/0106500 A1* | 8/2002 | Albano et al. | 428/304.4 |
| 2002/0123240 A1 | 9/2002 | Gallagher et al. | |
| 2002/0132496 A1 | 9/2002 | Ball et al. | |
| 2002/0141024 A1 | 10/2002 | Retschke et al. | |
| 2002/0192980 A1 | 12/2002 | Hogle et al. | |
| 2003/0049375 A1* | 3/2003 | Nguyen et al. | 427/255.28 |
| 2003/0064607 A1* | 4/2003 | Leu et al. | 438/780 |
| 2003/0066544 A1 | 4/2003 | Jur et al. | |
| 2003/0111263 A1 | 6/2003 | Fornof et al. | |
| 2003/0119307 A1 | 6/2003 | Bekiaris et al. | |
| 2003/0157248 A1 | 8/2003 | Watkins et al. | |
| 2003/0198895 A1 | 10/2003 | Toma et al. | |
| 2003/0224156 A1 | 12/2003 | Kirner et al. | |
| 2004/0018717 A1 | 1/2004 | Fornof et al. | |
| 2004/0069410 A1 | 4/2004 | Moghadam et al. | |
| 2004/0096586 A1 | 5/2004 | Schulberg et al. | |
| 2004/0096593 A1 | 5/2004 | Lukas et al. | |
| 2004/0096672 A1 | 5/2004 | Lukas et al. | |
| 2004/0099952 A1 | 5/2004 | Goodner et al. | |
| 2004/0101633 A1 | 5/2004 | Zheng et al. | |
| 2004/0102031 A1 | 5/2004 | Kloster et al. | |
| 2004/0102032 A1 | 5/2004 | Kloster et al. | |
| 2004/0151845 A1* | 8/2004 | Nguyen et al. | 427/569 |
| 2004/0161532 A1 | 8/2004 | Kloster et al. | |
| 2004/0170760 A1 | 9/2004 | Meagley et al. | |
| 2004/0185679 A1 | 9/2004 | Ott et al. | |
| 2004/0213911 A1 | 10/2004 | Misawa et al. | |
| 2004/0249006 A1 | 12/2004 | Gleason et al. | |
| 2005/0045206 A1 | 3/2005 | Smith et al. | |
| 2005/0064698 A1 | 3/2005 | Chang et al. | |
| 2005/0095840 A1 | 5/2005 | Bhanap et al. | |
| 2005/0230834 A1 | 10/2005 | Schmitt et al. | |
| 2005/0260357 A1 | 11/2005 | Olsen et al. | |
| 2006/0040507 A1 | 2/2006 | Mak et al. | |
| 2006/0105566 A1 | 5/2006 | Waldfried et al. | |
| 2006/0110931 A1 | 5/2006 | Fukazawa et al. | |
| 2006/0145305 A1 | 7/2006 | Boyanov et al. | |
| 2006/0178006 A1 | 8/2006 | Xu et al. | |
| 2006/0197881 A1 | 9/2006 | Kang et al. | |
| 2007/0077751 A1 | 4/2007 | Chen et al. | |
| 2007/0128882 A1 | 6/2007 | Nguyen et al. | |
| 2008/0194105 A1 | 8/2008 | Dominguez et al. | |

FOREIGN PATENT DOCUMENTS

| | | |
|---|---|---|
| WO | WO 02/21593 A2 | 3/2002 |
| WO | WO 03/005429 A1 | 1/2003 |

OTHER PUBLICATIONS

U.S. Office Action mailed Sep. 1, 2005, from U.S. Appl. No. 10/672,305.

U.S. Office Action mailed Jul. 13, 2005, from U.S. Appl. No. 10/672,311.

U.S. Office Action mailed Jul. 27, 2005, from U.S. Appl. No. 10/785,235.

Cho et al., "Method for Porogen Removal and Mechanical Strength Enhancement of Low-K Carbon Doped Silicon Oxide Using Low Thermal Budget Microwave Curing", U.S. Appl. No. 11/280,113, filed Nov. 15, 2005.

U.S. Office Action mailed Jan. 9, 2006, from U.S Appl. No. 10/785,235.

U.S. Office Action mailed Dec. 27, 2005, from U.S Appl. No. 10/789,103.

U.S. Office Action mailed Dec. 23, 2005, from U.S. Appl. No. 10/800,409.

U.S. Office Action mailed Feb. 7, 2006, from U.S Appl. No. 10/672,305.

U.S. Office Action mailed Dec. 20, 2005, from U.S Appl. No. 10/672,311.

Subramonium et al., "Pulsed PECVD Method for Modulating Hydrogen Content in Hard Mask", U.S. Appl. No. 11/318,269, filed Dec. 23, 2005.

U.S. Office Action mailed Feb. 28, 2006, from U.S. Appl. No. 10/404,693.

U.S. Office Action mailed Mar. 29, 2006, from U.S. Appl. No. 10/800,377.
U.S. Office Action mailed May 31, 2006, from U.S. Appl. No. 10/941,502.
U.S. Office Action mailed May 30, 2006, from U.S. Appl. No. 10/785,235.
U.S. Office Action mailed May 2, 2006, from U.S. Appl. No. 11/050,621.
U.S. Office Action mailed Jun. 15, 2006, from U.S Appl. No. 10/800,409.
Kelman et al., "Method for Reducing Stress in Porous Dielectric Films", U.S. Appl. No. 11/369,311, filed Mar. 6, 2006.
U.S. Office Action mailed Jun. 28, 2006, from U.S Appl. No. 10/825,888.
U.S. Office Action mailed May 2, 2006, from U.S Appl. No. 10/295,965.
U.S. Office Action mailed Aug. 9, 2005, from U.S. Appl. No. 10/295,965.
U.S. Office Action mailed Jul. 12, 2006, from U.S. Appl. No. 10/672,305.
U.S. Office Action mailed Sep. 8, 2006, from U.S. Appl. No. 10/404,693.
Wu et al., "Methods for Fabricating High Hardness/Modules Low Dielectric Constant Materials," Novellus Systems, Inc., U.S. Appl. No. 11/369,658, filed Mar. 6, 2006, pp. 1-33.
Dhas et al., "Method of Reducing Defects in PECVD TEOS Films," Novellus Systems, Inc., U.S. Appl. No. 11/396,303, filed Mar. 30, 2006, pp. 1-21.
Hoek et al., "VLSI Fabrication Processes for Introducing Pores Into Dielectric Materials," Novellus Systems, Inc., Appln No. Not yet assigned, Filed Nov. 28, 2006, pp. 1-35.
U.S. Office Action mailed Nov. 30, 2006, from U.S. Appl. No. 10/927,777.
U.S. Office Action mailed Dec. 27, 2006, from U.S. Appl. No. 10/825,888.
Niu et al., "Methods for Improving the Cracking Resistance of Low-k Dielectric Materials," Novellus Systems, Inc., U.S. Appl. No. 11/376,510, filed Mar. 14, 2006.
U.S. Office Action mailed May 22, 2007, from U.S. Appl. No. 11/376,510.
Notice of Allowance and Fee Due mailed Mar. 14, 2006 from U.S. Appl. No. 11/376,510.
Allowed Claims from U.S. Appl. No. 11/376,510.
Wang et al., "Reduction of Oxygen Plasma Damage by Postdeposition Helium Plasma Treatment for Carbon-Doped Silicon Oxide Low Dielectric Constant Films," Electrochemical and Solid-State Letters, 6 (1) F1-F3 (2003).
U.S. Office Action mailed Dec. 12, 2008, from U.S. Appl. No. 11/369,658.
Szekeres, A. et al., "Plasma-assisted chemical vapor deposited silicon oxynitride as an alternative material for gate dielectric in MOS devices." Microelectronics Journal 37 (2006) pp. 64-70.
Supplemental Notice of Allowance and Fee Due mailed May 1, 2008 from U.S. Appl. No. 11/376,510.
International Sematech Ultra Low-K Workshop, Jun. 2002, p. 1.
Cho et al., "Plasma Treatments of Molecularly Templated Nanoporous Silica Films," Electrochemical and Solid-State Letters, 4 (4) G35-G38 (2001).
Yung et al., "Spin-on Mesoporous Silica Films with Ultralow Dielectric Constants, Ordered Pore Structures, and Hydrophobic Surfaces," Adv. Mater. 2001, *13*, No. 14, 1099-1102.
Schulberg et al., "System for Deposition of Mesoporous Materials," U.S. Appl. No. 10/295,965, filed Nov. 15, 2002, 64 Pages.
Watkins et al., "Mesoporous Materials and Methods," U.S. Appl. No. 10/301,013, filed Nov. 21, 2002, 34 Pages.
Justin F. Gaynor, "In-Situ Treatment of Low-K Films With a Silylating Agent After Exposure To Oxidizing Environments," U.S. Appl. No. 10/056,926, filed Jan. 24, 2002, 34 Pages.
Humayun et al., "Method for Forming Porous Films by Porogen Removel Combined Wtih in SITU Surface Modification", Novellus Corporation, U.S. Appl. No. 10/404,693, filed Mar. 31, 2003, pp. 1-32.

Tipton et al., "Method of Porogen Removal From Porous Low-K Films Using UV Radiation", Novellus Systems, Inc., U.S. Appl. No. 10/672,311, filed Sep. 26, 2003, pp. 1-27.
Jan, C.H., et al, *90NM Generation, 300mm Wafer Low k ILD/Cu Interconnect Technology*, 2003 IEEE Interconnect Technology Conference.
Wu et al., U.S. Appl. No. 10/789,103, entitled: Methods For Producing Low-K CDO Films With Low Residual Stress, Feb. 27, 2004.
Wu et al., U.S. Appl. No. 10/820,525, entitled: Methods For Producing Low-K CDO Films With Low Residual Stress, Apr. 22, 2004.
Wu et al., U.S. Appl. No. 10/800,409, entitled: Methods For Producing Low-K CDO Films, Mar. 26, 2004.
U.S. Appl. No. 10/016,017, filed Dec. 12, 2001.
U.S. Appl. No. 10/125,614, filed Apr. 18, 2002.
U.S. Appl. No. 10/202,987, filed Jul. 23, 2002.
Tipton et al., "Method for Removal of Porogens From Porous Low-K Films Using Supercritical Fluids", Novellus Systems, Inc., U.S. Appl. No. 10/672,305, filed Sep. 26, 2003, pp. 1-32.
Gangpadhyay et al., "The First International Surface Cleaning Workshop," Northeastern University, Nov. 11-14, 2002.
Cho et al., "Method and Apparatus for UV Exposure of Low Dielectric Constant Materials for Porogen Removal and Improved Mechanical Properties", Novellus Systems, Inc., U.S. Appl. No. 10/800,377, filed Mar. 11, 2004, pp. 1-31.
Wu et al., "Method and Apparatus of UV Exposure of Low Dielectric Constant Materials for Porogen Removal and Improved Mechanical Properties", Novellus Systems, Inc., U.S. Appl. No. 10/807,680, filed Mar. 23, 2004, pp. 1-34.
Humayun et al., "Method for Forming Porous Films by Porogen Removal Combined With In Situ Modification", U.S. Appl. No. 10/404,693, filed Mar. 31, 2003, Office Action dated Mar. 15, 2005.
Tipton et al., "Method Of Porogen Removal From Porous Low-K Films Using UV Radiation", U.S. Appl. No. 10/672,311, filed Sep. 26, 2003, Office Action dated Sep. 7, 2004.
Tipton et al., "Method Of Porogen Removal From Porous Low-K Films Using UV Radiation", U.S. Appl. No. 10/672,311, filed Sep. 26, 2003, Office Action dated Dec. 28, 2004.
Tipton et al., "Method for Removal Of Porogens From Porous Low-K Films Using Supercritical Fluids", U.S. Appl. No. 10/672,305, Office Action dated Mar. 22, 2005.
Bandyopadhyay et al., "Method to Improve Mechanical Strength of Low-K Dielectric Film Using Modulated UV Exposure", U.S. Appl. No. 10/825,888, filed Apr. 16, 2004.
R.D. Miller et al., "Phase-Separated Inorganic-Organic Hybrids for Microelectronic Applications," MRS Bulletin, Oct. 1997, pp. 44-48.
Jin et al., "Nanoporous Silica as an Ultralow-*k* Dielectric," MRS Bulletin, Oct. 1997, pp. 39-42.
Asoh et al., "Fabrication of Ideally Ordered Anodic Porous Alumina with 63 nm Hole Periodocity Using Sulfuric Acid," J. Vac. Sci. Technol. B 19(2), Mar./Apr. 2001, pp. 569-572.
Asoh et al., "Conditions for Fabrication of Ideally Ordered Anodic Porous Alumina Using Pretextured Al," Journal of the Electrochemica Society, 148 (4) B152-B156 (2001) pp. B152-B156.
Holland et al., "Nonlithographic Technique for the Production of Large Area High Density Gridded Field Sources," J. Vac. Sci. Technol. B 17(2), Mar./Apr. 1999, pp. 580-582.
Masuda et al. "Highly Ordered Nanochannel-Array Architecture in Anodic Alumina," App. Phys. Lett. 71(19), Nov. 1997, pp. 2770-2772.
Clube et al., White Paper from Holotronic Technologies SA; downloaded from www.hdotronic.com/whitepaper/fine-patt.pdf on Mar. 12, 2002.
Meli et al., "Self-Assembled Masks for the Transfer of Nanometer-Scale Patterns into Surfaces: Characterization by AFM and LFM", Nano Letters, vol. 2, No. 2, 2002, 131-135.
"Shipley Claims Porous Low K Dielectric Breakthrough," Press Release Mar. 17, 2003.
Jeffrey M. Calvert and Michael K. Gallagher, Semiconductor International, 26 (12), 56 (2003).
Van Bavel et al., Future Fab International, 16, (2004).
Caluwaerts et al, "Post Patterning Meso Porosity Creation: A Potential Solution For Pore Sealing," IITC 2003.

Peter Singer, "New Materials and Designs to Improve Transistor Performance", Apr. 1, 2004, Semiconductor International.

Ghani et al, "A 90nm High Volume Manufacturing Logic Technology Featuring Novel 45nm Gate Length Strained Silicon CMOS Transistors", IEEE, © 2003.

Bhadri N. Varadarajan, "Tensile Silicon Nitride—P1264 NESL", C & F Study, Aug. 21, 2003.

Varadarajan, et al., "Strained Transistor Architecture and Method", Novellus Systems, Inc., U.S. Appl. No. 10/923,259, filed Aug. 20, 2004, pp. 1-24.

Niu et al., "Methods For Improving The Cracking Resistance Of Low-K Dielectric Materials", U.S. Appl. No. 10/860,340, filed Jun. 2, 2004.

Niu et al., "Methods for Improving The Cracking Resistance Of Low-K Dielectric Materials", U.S. Appl. No. 10/860,340, Office Action dated Mar. 2, 2005.

Niu et al., "Methods For Improving The Cracking Resistance Of Low-K Dielectric Materials", U.S. Appl. No. 10/860,340, Final Office Action dated Jun. 13, 2005.

Wang et al., "Plasma Detemplating And Silanol Capping Of Porous Dielectric Films", U.S. Appl. No. 10/785,235, filed Feb. 23, 2004.

Varadarajan et al., "Tensile Dielectric Films Using UV Curing", U.S. Appl. No. 10/972,084, filed Oct. 22, 2004.

Fox et al., "Methods For Producing Low-Stress Carbon-Doped Oxide Films With Improved Integration Properties", U.S. Appl. No. 10/987,208, filed Nov. 12, 2004.

Van Den Hoek et al., "VLSI Fabrication Processes For Introducing Pores Into Dielectric Materials," U.S. Appl. No. 11/050,621, filed Jan. 31, 2005.

Draeger et al., "Creation Of Porosity In Low-K Films by Photo-Disassociation Of Imbedded Nanoparticles," U.S. Appl. No. 11/146,456, filed Jun. 6, 2005.

Wu et al., "Methods For Producing Low Stress Porous Low-K Dielectric Materials Using Precursors With Organic Functional Groups", U.S. Appl. No. 10/927,777, filed Aug. 27, 2004.

Wu et al., "Methods for Improving Integration Performance Of Low Stress CDO Films", U.S. Appl. No. 10/941,502, filed Sep. 14, 2004.

Cho et al., "Methods of Improving Porogen Removal and Film Mechanical Strength in Producing Ultra Low-K Carbon Doped Oxide Films Using Radical Photopolymerization", U.S. Appl. No. 10/982,654, filed Nov. 5, 2004.

* cited by examiner

METHOD FOR IMPROVING MECHANICAL PROPERTIES OF LOW DIELECTRIC CONSTANT MATERIALS

FIELD OF THE INVENTION

This invention relates to methods for preparing dielectric films having low dielectric constants and high mechanical strength. More specifically, the methods involve the deposition of a dielectric film as a series of sub-layers, each of which is plasma treated for hardening.

BACKGROUND

There is a general need for materials with low dielectric constants (low-k) in the integrated circuit manufacturing industry. Using low-k materials as the intermetal and/or interlayer dielectric of conductive interconnects reduces the delay in signal propagation due to capacitive effects. The lower the dielectric constant of the dielectric, the lower the capacitance of the dielectric and the lower the RC delay in the lines of the IC.

Low-k dielectrics are conventionally defined as those materials that have a dielectric constant lower than that of silicon dioxide, that is k<~4. Typical methods of obtaining low-k materials include doping silicon dioxide with carbon, various hydrocarbon groups or fluorine.

Low dielectric constant materials (k<3) with improved material properties will enable easier integration into the interconnect stack. For instance, using an organosiloxane (For example: tetramethylcyclotetrasiloxane (TMCTS)) as a precursor in a conventional deposition process, the resulting dielectric will possess a dielectric constant of 2.60-2.95 with a modulus of 5-10 GPa (hardness of 0.8-1.8 GPa) and a typical cracking threshold less than 2.5 μm. It is believed that many applications will require a modulus greater than about 10.0 GPa (hardness of greater than about 2.0 GPa) and cracking thresholds of greater than 4 micrometers. It is not uncommon for a modern IC design to require nine metallization layers, each with a separate dielectric layer. Each of these dielectric layers will have to withstand mechanical-stresses from, for example, chemical-mechanical polishing and/or thermal and mechanical stresses incurred during IC packaging operations. A fragile dielectric may crack or delaminate under these stresses, leading to fewer functional ICs (lower yields) during fabrication. In order to avoid these problems, it is desirable to create a dielectric with a high mechanical strength.

SUMMARY

To achieve the abovementioned, and in accordance with the purpose of the present invention, methods of forming a dielectric layer having a low dielectric constant and a high mechanical strength, are disclosed. In particular, methods involve (a) depositing a first sub-layer of a dielectric material on a substrate, (b) treating the sub-layer with a plasma in a manner that improves the mechanical strength of the dielectric layer, (c) depositing an additional layer of dielectric material on the previous plasma-treated sub-layer, and (d) plasma treating the additional sub-layer in a manner that improves the mechanical strength of the dielectric layer. In some embodiments, steps (c) and (d) are repeated one or more times until the dielectric layer attains a desired thickness. Further, the substrate is a partially fabricated semiconductor substrate in some embodiments.

In some embodiments, the dielectric layer is a carbon doped silicon oxide. In other embodiments the dielectric layer is a fluorine doped silicon oxide. In one embodiment, each sub-layer has a thickness between about 10 Angstroms and 1 micrometer. In a preferred embodiment, the sub-layers are between about 20-500 Angstroms thick.

In preferred embodiments, this approach may be used to realize improvement in hardness/modulus and cracking limits of >10%. Since one goal of the present invention is to form a dielectric layer with a low dielectric constant, preferred embodiments will have a dielectric constant of at most about 3.

The dielectric layer can be formed using a CVD process (e.g., a plasma enhanced chemical deposition (PECVD) technique.) In a preferred embodiment, each of the process steps is performed in a single reaction chamber or multiple reaction chambers by generating a plasma. The precursor may be selected from molecules containing silicon, carbon, oxygen and hydrogen, such as silanes, alkylsilanes (e.g., trimethylsilane and tetramethylsilane), alkoxysilanes (e.g., methyltriethoxysilane (MTEOS), methyltrimethoxysilane (MTMOS) diethoxymethylsilane (DEMS), methyldimethoxysilane (MDMOS), trimethylmethoxysilane (TMMOS) and dimethyldimethoxysilane (DMDMOS)), linear siloxanes and cyclic siloxanes (e.g. octamethylcyclotetrasiloxane (OMCTS) and tetramethylcyclotetrasiloxane (TMCTS)). The treatment gases may include both heavy atoms (e.g., Ar) and/or light atoms (e.g., He). Inert gases including nitrogen or reactive gases such as carbon dioxide, oxygen, hydrogen, F containing gases including $CF_4$, $C_2F_6$, or any combination of the above may be used as well. In one embodiment of the invention, 22 slm of Argon and 5 slm of Helium gas are supplied at 15 Torr for 20 seconds during each plasma treatment phase. The plasma is generated using a power of 500 W at a frequency of 13.56 MHz. Note, however, that in some embodiments of the invention, multiple frequencies may be used simultaneously. Further, the plasma treatment performed between depositing dielectric layers involves halting the flow of the dielectric precursor gas while maintaining the same reactor process conditions as the plasma treatment gases are supplied.

These and other features and advantages of the invention will be presented below with reference to the associated drawings.

DETAILED DESCRIPTION OF A PREFERRED EMBODIMENT

Introduction and Overview

The present invention relates to methods of creating low-k dielectric materials with high mechanical strength. "Mechanical strength", in the context of this invention maybe manifest in terms of hardness, modulus, intrinsic stresses, cracking threshold, fracture toughness, cohesive strength, and the like. Hardness and modulus are well defined within the art and will not be discussed in detail herein. Measures of film hardness presented herein may be made with any suitable apparatus including a Nanoindenter.

"Cracking threshold" in a dielectric film is related to the film's modulus and stress. Cracking threshold is measured by the thickness of the film on a blank substrate (e.g., a flat 200 mm or 300 mm silicon wafer) that can be deposited without forming a crack. In a typical experiment, the dielectric film is deposited to various thicknesses using a single set of process conditions. The resulting wafer (with dielectric layer) is set aside without disturbance for a period of time (e.g., one day) and examined for cracks. The greatest thickness at which no crack is observed is designated the cracking threshold. For many processes, the cracking threshold is measured in micrometers. Cracking threshold is a measure of the dielectric film's mechanical strength. Higher the cracking threshold, better the film mechanical strength and easier the ability to integrate the film into the interconnect stack.

This document discloses a generalized procedure for forming a number of sub-layers, with each sub-layer undergoing a plasma treatment in order to improve the mechanical properties of the dielectric layer without substantially changing its dielectric constant (k) value or other important film properties.

Figure 1:
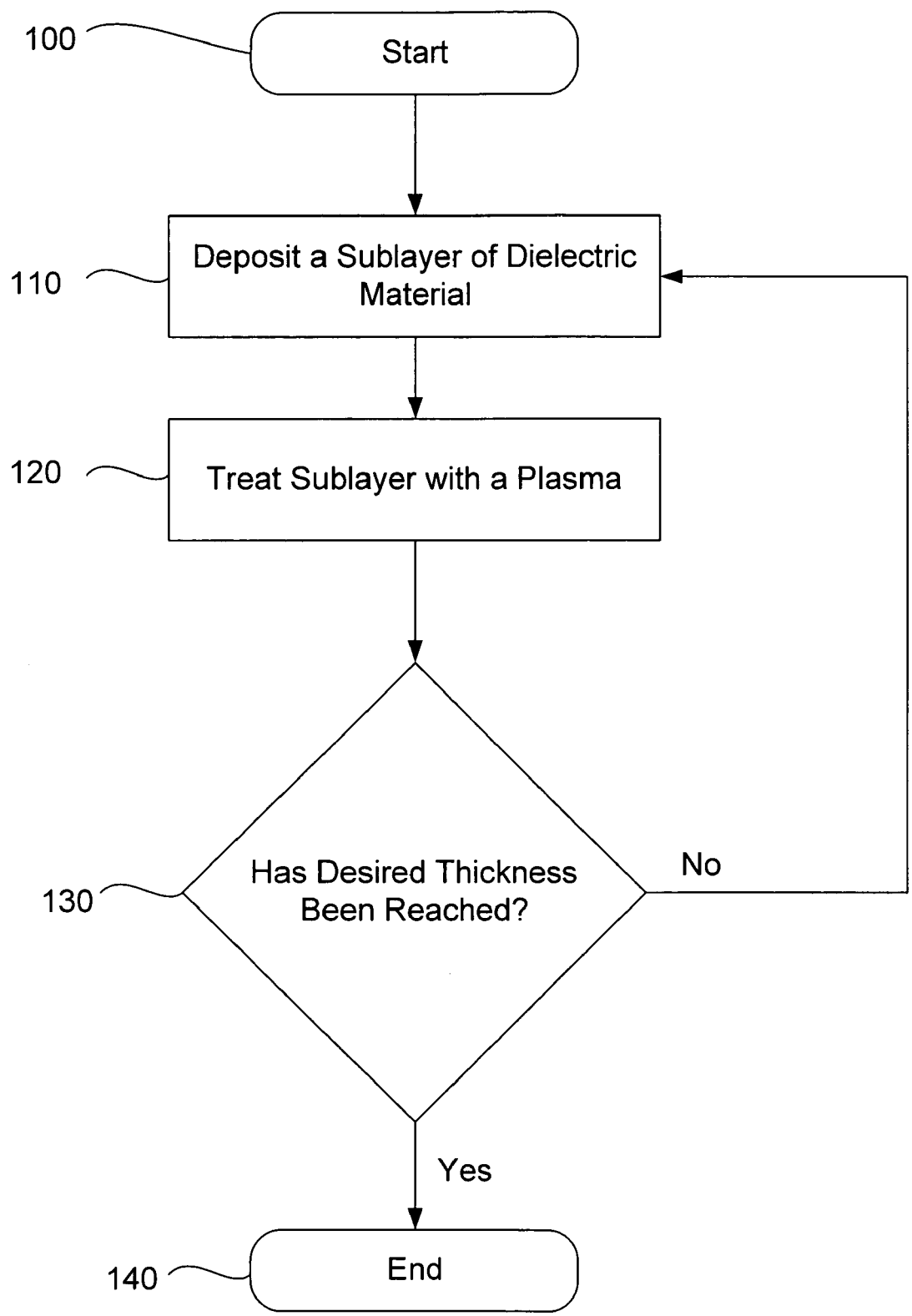
FIG. 1 is a process flow diagram depicting a process context of the present invention.

The process used to form the individual sub-layers is illustrated in FIGS. 1 and 2(a)-2(e). In FIG. 1, step 110, a sub-layer of dielectric material is deposited on a substrate material, followed by a plasma treatment step 120, which serves to improve the sub-layer's mechanical properties. Steps 110 and 120 are repeated as necessary until the dielectric layer has reached the desired thickness.

Figure 2A:
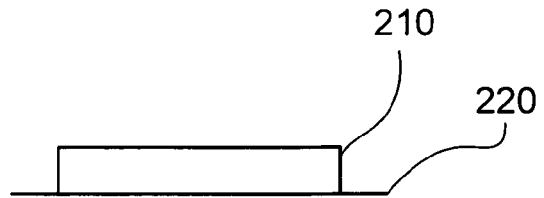
FIGS. 2(a)-(e) depict a series of cross sectional views of the process steps described in FIG. 1.
Figure 2B:
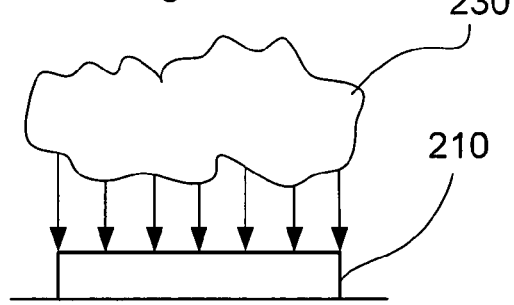
Figure 2C:
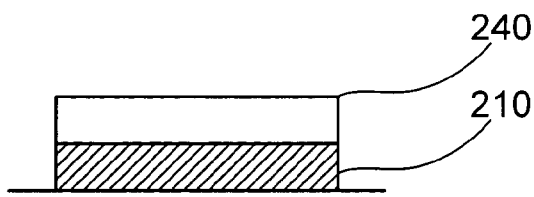
Figure 2D:
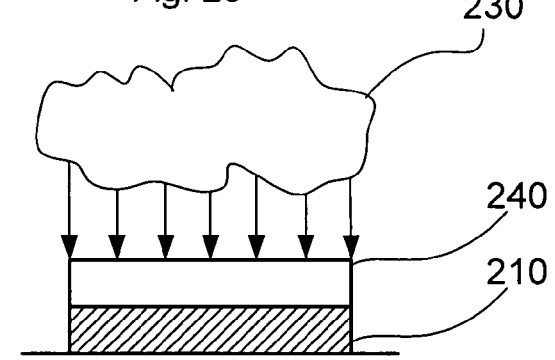
Figure 2E:
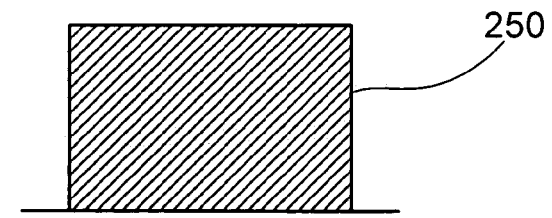

This same process is shown again, in a graphical form, in FIGS. 2(a)-2(e). FIG. 2(a) illustrates a dielectric sub-layer 210 deposited on a substrate 220. In FIG. 2(b), a plasma treatment 230 is used to modify dielectric sub-layer 210 resulting in sub-layer with improved mechanical properties. FIG. 2(c) shows a second dielectric sub-layer 240 deposited on top of treated sub-layer 210 and FIG. 2(d) shows a second plasma treatment 230 being used to harden second dielectric sub-layer 240. Finally, FIG. 2(e) shows completed dielectric layer 250, formed by repeatedly depositing sub-layers and plasma treating each sub-layer as illustrated in FIGS. 2(a)-2(d).

Preparing the Individual Dielectric Sub-Layers

This invention is applicable to several different dielectric film compositions. In some embodiments, the composition includes silicon and oxygen. Sometimes it may also include one or a combination of carbon, fluorine, and/or other elements and even metals, in addition to silicon, oxygen and hydrogen. In many cases, the dielectric will be a fluorine doped oxide or a carbon-doped oxide (CDO). The dielectric may be of the "high density" variety (substantially pore free) or the "low density" variety (porous). In either case, the material preferably has a relatively low dielectric constant (e.g., less than about 4, and more typically less than about 3), yet need not have a relatively high mechanical strength.

For many embodiments, the dielectric layer has a composition comprising between about 5 and 33 atomic percent silicon and between about 10 and 66 atomic percent oxygen. It may also include, optionally, between about 10 and 30 atomic percent carbon and/or between about 1 and 30 atomic percent fluorine. Material may also have between 1 and 50 atomic percent hydrogen.

Examples of precursors for CDO dielectrics include molecules containing at least Si, C, O, H and F atoms, such as silanes, alkylsilanes (e.g., trimethylsilane and tetramethylsilane), alkoxysilanes (e.g., methyltriethoxysilane (MTEOS), methyltrimethoxysilane (MTMOS) diethoxymethylsilane (DEMS), methyldimethoxysilane (MDMOS), trimethylmethoxysilane (TMMOS) and dimethyldimethoxysilane (DMDMOS)), linear siloxanes and cyclic siloxanes (e.g. octamethylcyclotetrasiloxane (OMCTS) and tetramethylcyclotetrasiloxane (TMCTS)). Note that one example of a silane is di-tert-butylsilane.

Any number of deposition methods may be employed to form the individual sub-layers of the dielectric material. These include various forms chemical vapor deposition (CVD) including plasma enhanced CVD (PECVD) and high-density plasma (HDP CVD). HDP CVD of dielectric materials is described in various sources including U.S. patent application Ser. No. 09/996,619, filed Nov. 28, 2001 by Atiye Bayman et al. and titled "Gap Fill for High Aspect Ratio Structures", which is incorporated herein by reference for all purposes. Other techniques such as spin on techniques and deposition from supercritical solutions may also be employed.

Typically, the individual dielectric sub-layers are substantially non-porous and dense. Of course, it is possible that the invention could be employed to form porous films as well. Methods of fabricating porous dielectrics typically involve forming a composite film containing two components: a porogen (typically an organic material such as a polymer) and a structure former or dielectric material (e.g., a silicon containing material). Once the precursor film is formed on the substrate, the porogen component is removed, leaving a structurally intact porous dielectric matrix. Techniques for removing porogens from the precursor film include, for example, a thermal process in which the substrate is heated to a temperature sufficient for the breakdown and vaporization of the organic porogen, ultraviolet radiation and/or plasma mediated decomposition of the porogen, and extraction and/or breakdown with a supercritical solution.

In some cases the porogen is randomly distributed throughout the precursor film and other cases it is ordered in a repeating structure throughout the film. In the case of an ordered porous or mesoporous dielectric matrix, the porogen is frequently referred to as a "template." One type of ordered porogen, for example, is a block copolymer that has chemically distinct components (e.g. PEO polyethylene oxide and PPO polypropylene oxide) that segregate into separate phases. The discussion herein will refer to porogen and porogen materials in general and are intended to include any type of porogen, ordered or non-ordered, organic or inorganic, unless otherwise specified.

Frequently, the porogen is a hydrocarbon. One class of hydrocarbon porogens is the polyfunctional cyclic non-aromatic compounds, particularly alpha-terpinenes (ATRP). Suitable alpha-terpinene derivatives include, for example, alpha-terpinene itself, substituted alpha-terpinenes, and multi-ring compounds containing the alpha-terpinene nucleus. Other compounds include functional groups such as —CH=$CH_2$, —CH=CH—, —C≡CH, —C≡C—, —C=O, —$OCH_3$. A typical example of these compounds is 1,2,3,4-tetramethyl-1,3-cyclopentadiene (TMCP) ($C_9H_{14}$). Three-dimensional multi-ring compounds such as 5-ethylidene-2-norbornene (ENB) are also suitable.

The thickness of the individual sub-layers can be adjusted for the particular needs of an application and/or the constraints of the process and apparatus. In one embodiment of the invention, the individual sub-layers are deposited at thicknesses ranging from about 10-10000 Å. For many applications, it is desirable to employ sub-layers that are as thin as possible. So it is often preferable to employ sub-layers in the range of about 20-500 angstroms. In some ultra-thin layer embodiments described below the deposited thickness is preferably between about 20-30 angstroms per cycle. By using only very thin sub-layers, one reduces the variations in the vertical composition profile, thereby reducing potential issues associated with non-uniform etching, etc.

The ultimate thickness of the multi-layer dielectric film depends upon the application. Frequently, the thickness will range between about 3 nanometers and 3 micrometers. As an example, the final thickness may range between about 50 to 1500 angstroms for a hard mask application. For an interlayer dielectric or packaging application, the thickness may range up to about 2 to 3 microns. In some cases, extra thickness is required to provide some amount of sacrificial dielectric to accommodate a subsequent planarization step.

In some cases, the material properties of the as-deposited (before plasma treatment) film may be important. A film deposited using the methods discussed above will have a modulus of at least about 0.5 to 60 GPa (hardness of at least about 0.1 to 10 GPa), a cracking threshold of at least about 1 micrometer, and a dielectric constant of at most 4.

Plasma Treatment

As discussed above in reference to FIGS. 1 and 2(*a*)-(*e*), the plasma treatment of the sub-layers of dielectric material is performed such that the mechanical properties of the dielectric layer are improved to produce dielectric layers having greater hardness and modulus than those created by conventional techniques. Preferably, plasma treatment and sub-layer thicknesses are adjusted such that the dielectric layer has modulus of at least about 6 GPa (hardness of at least about 1.0 GPa), more preferably a modulus of at least about 10 GPa (hardness of at least about 2 GPa) and cracking threshold of at least about 1.5 μm (more preferably at least about 4 μm). More preferably, modulus is between about 2 and 18 GPa (hardness is between about 0.3 and 3 GPa), and the cracking threshold is between about 0.5 and 10 μm. As discussed in reference to FIG. 2(*a*)-(*e*), a plasma treatment is preferably performed on the dielectric material after each sub-layer of dielectric material is applied. It is envisioned that some embodiments may skip the plasma treatment after one or more of the sub-layers is deposited.

Many different types of plasma gases may be used to form the dielectric layer. They may be either inert or reactive. Sometimes it will be desirable that some reaction or doping that results from interaction with a non-inert plasma. For example, it may be desirable to employ a fluorine-containing plasma to give some level of fluorine doping in the dielectric layer. Exemplary plasma forming gases include $H_2$, He, Ar, $O_2$, $CO_2$, $N_2$, and fluorine containing gases (e.g., $CF_4$, $C_2F_6$, $SiF_4$, $C_3F_8$, NF). Any combination of these gases (possibly with other gases as well) may be used to perform the plasma hardening treatment.

Another consideration in choosing plasma gases is whether to use heavy atoms (e.g., argon) or light atoms (e.g., helium). A heavier atom may be used when material redistribution or "sputtering" is desired. This is useful in facilitating bond reconstruction within the dielectric materials and in improving its mechanical strength. However, using a heavier atom may increase the k value of the dielectric. Thus, it may often be desirable to have a mix of both heavy and light atoms in the plasma. In one preferred embodiment the plasma treatment gases are argon and helium.

Another consideration, in some cases, is whether to use an ionized gas (e.g. Ar+) over electronegative ionized gases such as $F^-$, $CO_2^-$, or $O_2^-$. It has been found that oxygen-containing gases can increase the dielectric constant of the dielectric layer. Still the invention is not limited to positively charged gases or electropositive process gases. For some applications, ionized oxygen may be appropriate.

The plasma may be formed in situ (in the same process chamber that houses the substrate) or remotely in separate chamber or compartment. In the later case, the remotely generated plasma must be introduced to the chamber where the substrate resides and there interact with the dielectric to harden it.

According to the present invention, each process gas for the plasma treatment is supplied at a specified flow rate or in a measured amount at a specific pressure after each layer of dielectric is applied. In a preferred embodiment, the pressure range employed for the plasma treatment ranges between about 10 mTorr and 20 Torr, and more preferably between about 0.1 Torr and 10 mTorr.

The appropriate plasma density and power at the substrate surface, as well as the exposure time of the substrate will vary depending upon the composition and thickness of the dielectric sub-layer to be treated. In one example, the plasma is created by an electromagnetic field having a power of between about 50 and 5000 Watts, more preferably between about 100 and 3000 Watts. The frequency of the electromagnetic field may vary depending upon the apparatus and desired process conditions. A frequency of about 200 kHz to 13.56 MHz, or a combination thereof is commonly used. If a PECVD process is being used, the frequency and power may be chosen to match that of the deposition step (which is desirably performed in the same reaction chamber as the plasma treatment). This makes for convenient processing as there are few process variations within a single reactor.

For many applications, the plasma exposure time will be between about 1 and 3600 seconds, and more preferably between about 1 and 300 seconds. As indicated this will be a function of the plasma conditions, the dielectric sub-layer composition, and the dielectric sub-layer thickness.

Recognize that while the plasma treatment will improve the mechanical strength of the dielectric layer, it may also increase its dielectric constant slightly. This is typically not a significant problem because the process may employ a starting material having a dielectric constant that is slightly lower than that ultimately required for the application. For example, if the process requires a dielectric having k of 2.8, the process may employ an untreated dielectric having a k of 2.7. The plasma treatment might increase the dielectric constant to 2.8 but correspondingly increase the modulus from 9 to 18.7 GPa (hardness from 1.5 to 2.8 GPa).

Apparatus

The present invention can be implemented in many different types of apparatus. Generally, the apparatus will include one or more chambers or "reactors" (sometimes including multiple stations) that house one or more wafers and are suitable for wafer processing. A single chamber may be employed for all operations of the invention (both sub-layer deposition and plasma treatment) or separate chambers may be used. Each chamber may house one or more wafers for processing. The one or more chambers maintain the wafer in a defined position or positions (with or without motion within that position, e.g. rotation, vibration, or other agitation). In one embodiment, a wafer undergoing dielectric deposition is transferred from one station to another within the reactor during the process. For example, the wafer may be held at a first station during deposition and a second station during plasma treatment. While in process, each wafer is held in place by a pedestal, wafer chuck and/or other wafer holding apparatus. For certain operations in which the wafer is to be heated, the apparatus may include a heater such a heating plate. As indicated, various methods may be used to produce the individual sub-layers, including various types of chemical vapor deposition (CVD) processes. In a preferred embodiment of the invention, a PECVD (Plasma Enhanced Chemical Vapor Deposition) system such as the "VECTOR" PECVD platform reactor available from Novellus Systems, Inc. of San Jose, Calif., but other forms of CVD may be used as well, for example HDP CVD (High Density Plasma Chemical Vapor Deposition).

Figure 3:
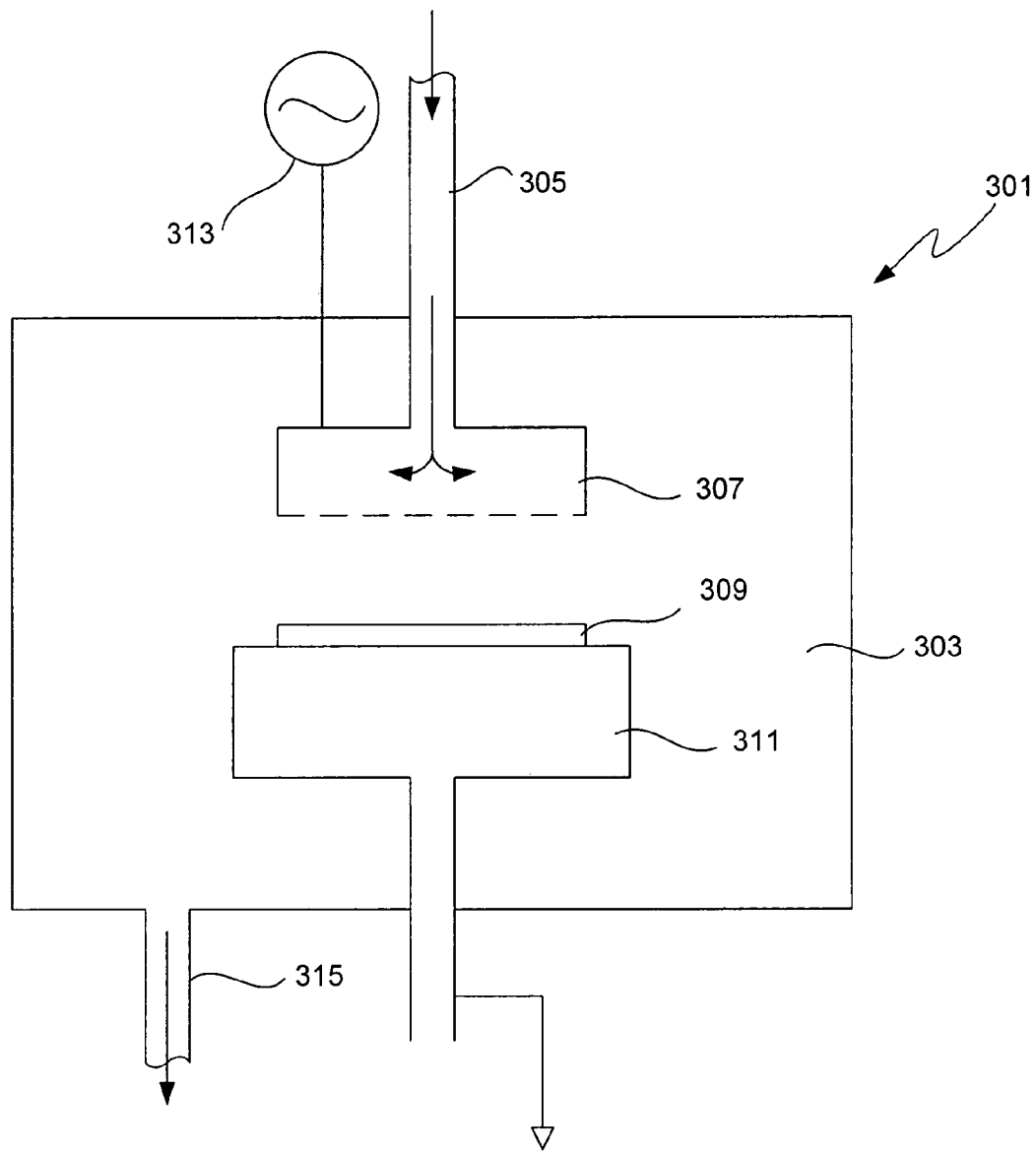
FIG. 3 is a block diagram depicting some components of a suitable CVD reactor for performing PECVD in accordance with this invention.

FIG. 3 provides a simple block diagram depicting various reactor components arranged as in a conventional reactor. As shown, a reactor 301 includes a process chamber 303, which encloses other components of the reactor and serves to contain the plasma. The gases and precursors used in the deposition process are introduced via line 305 and enter the chamber via showerhead 307. The substrate 309 is placed on heated substrate holder 311, which may be grounded or biased. A radio frequency (RF) source 313 is connected to showerhead 307, which serves as an electrode in order to generate a plasma. The power and frequency supplied by source 313 is sufficient to generate a plasma from the process gas(es), for example 500 W at 13.56 MHz. Process gases exit chamber 303 via outlet 315. A vacuum pump (e.g., a turbomolecular pump) typically draws process gases out and maintains a suitably low pressure within the reactor. A vacuum pump (e.g., a turbomolecular pump) typically draws process gases out and maintains a suitably low pressure within the reactor.

Thin Layer Embodiment

Preferably, to maximize throughput, a single reactor with either single or multiple stations is employed and the wafer is held in one place during successive deposition and plasma treatment phases. In a particular embodiment, a PECVD process is employed to form the sub-layers. Hence, a plasma may be ignited at the beginning of the process and maintained during the entire process. During deposition phases, the process gases include chemical precursors to the dielectric film (e.g., TMCTS and carbon dioxide) in carrier gas that may help maintain the plasma (e.g., an argon helium mixture). During plasma treatment phases, the flow of the chemical precursors is turned off, while the carrier continues to flow. Thus, the recently deposited sub-layer is exposed plasma for a period of time and thereby hardened before the next sub-layer is deposited. By utilizing the same plasma conditions for deposition and plasma treatment operations (the only difference being presence or absence of dielectric precursor material), one can run the overall deposition phase very rapidly. In a preferred embodiment, only very thin sub-layers are deposited (e.g., on the order of about 20-30 angstroms per cycle).

Applications

The above-described processes and apparatus may deposit dielectric on any type of substrate that requires thin dielectric layers. The substrate may be a semiconductor wafer having gaps in need of dielectric filling. The invention is not, however, limited to such applications. It may be employed in a myriad of other fabrication processes such as processes for fabricating flat panel displays.

Generally, however, this invention finds particular value in integrated circuit fabrication. The dielectric deposition is performed on partially fabricated integrated circuits employing semiconductor substrates. In specific examples, the dielectric forming processes of this invention are employed to form shallow trench isolation, pre-metal dielectric (dielectric between active devices and first metallization layer), inter-metal dielectric layers (dielectric between successive metallization layers), passivation layers, etc.

As indicated above, the ultimate thickness of the multi-layer dielectric film depends upon the application. For example, the final thickness may range between about 50 to 1500 angstroms for a hard mask application. For an interlayer dielectric or packaging application, the thickness may range up to about 2 to 3 microns. In some cases, extra thickness is required to provide some amount of sacrificial dielectric to accommodate a subsequent planarization step.

Bearing in mind that sometimes the plasma treatment may slightly increase the dielectric constant of the deposited material, one should choose starting material to have dielectric constant just slightly below the requirements of the application at hand. Assume, for example, that the plasma processing will increase the dielectric constant slightly and the process requires a material having a dielectric constant of k=2.8. In such case, it may be desirable to start the process by depositing a dielectric having a dielectric constant of k=2.7.

EXPERIMENTAL EXAMPLES

In one example, a stacked dielectric film was prepared in accordance with this invention. Sample hardness and dielectric constant were measured and compared to those using a comparable unstacked dielectric film prepared via a conventional process. To produce the stacked film, in accordance with this invention, each new layer of dielectric was deposited to a thickness of approximately 500 angstroms from a TMCTS precursor and carbon dioxide using a PECVD chamber (Vector™). Plasma treatment is performed while maintaining gas flows of Argon at 22 standard liters per minute (slm) and He at 5 slm, with the process chamber pressure maintained at 15 Torr and with high frequency (13.56 MHz) RF power of 2000 Watts for 5 seconds for every 500 angstroms of film. This plasma treatment is repeated every 500 angstrom to grow a 10000 angstrom film. The film produced incorporating this invention had a dielectric constant of 2.92, hardness of 2.8 GPa and Modulus of 18.7 GPa, while the film prepared using conventional process had a dielectric constant of 2.85, hardness of 1.45 GPa and modulus of 8.6 GPa.

After each dielectric sub-layer was deposited, the precursor gases were shut off in the deposition chamber and the dielectric was exposed to plasma. Each plasma phase of the process employed 22 slm of argon gas and 5 slm of helium gas for 5 seconds and held at a pressure of 15 Torr. The power applied to the upper electrode (for generating the plasma) was approximately 2000 W at 13.56 MHz held for 5 seconds between applications of dielectric material. Twenty sub-layers of dielectric were deposited on top of one another and separately plasma treated in this manner.

The resulting stacked dielectric layer has a modulus of about 18.7 GPa (hardness of about 2.8 GPa), a cracking threshold greater than 5 micrometers and a dielectric constant of 2.92. The conventional dielectric film (having a thickness of approximately 1 micrometer) produced from same material had a modulus of 8.6 GPa (hardness of 1.45 GPa), a cracking threshold of 2.5 micrometer and a dielectric constant of 2.85 without the sub-layering and accompanying intermediate plasma treatments.

In another example, a stacked dielectric film was prepared in accordance with this invention. To produce the stacked film, in accordance with this invention, each new layer of dielectric was deposited to a thickness of approximately 500 angstroms from a TMCTS precursor and carbon dioxide using a PECVD chamber (Vector™). Plasma treatment is performed while maintaining gas flows of Argon at 15 slm and He at 2.5 slm, with the process chamber pressure maintained at 15 Torr and with high frequency (13.56 MHz) RF power of 1000 Watts and low frequency (400 kHz) RF power of 500 W for 5 seconds for every 500 angstroms of film. This plasma treatment is repeated every 500 angstrom to grow a 10000 angstrom film. The film produced incorporating this invention had a dielectric constant of 2.9, hardness of 2.4 GPa and Modulus of 15.1 GPa, while the film prepared using conventional process had a dielectric constant of 2.85, hardness of 1.45 GPa and modulus of 8.6 GPa.

Figure 4:
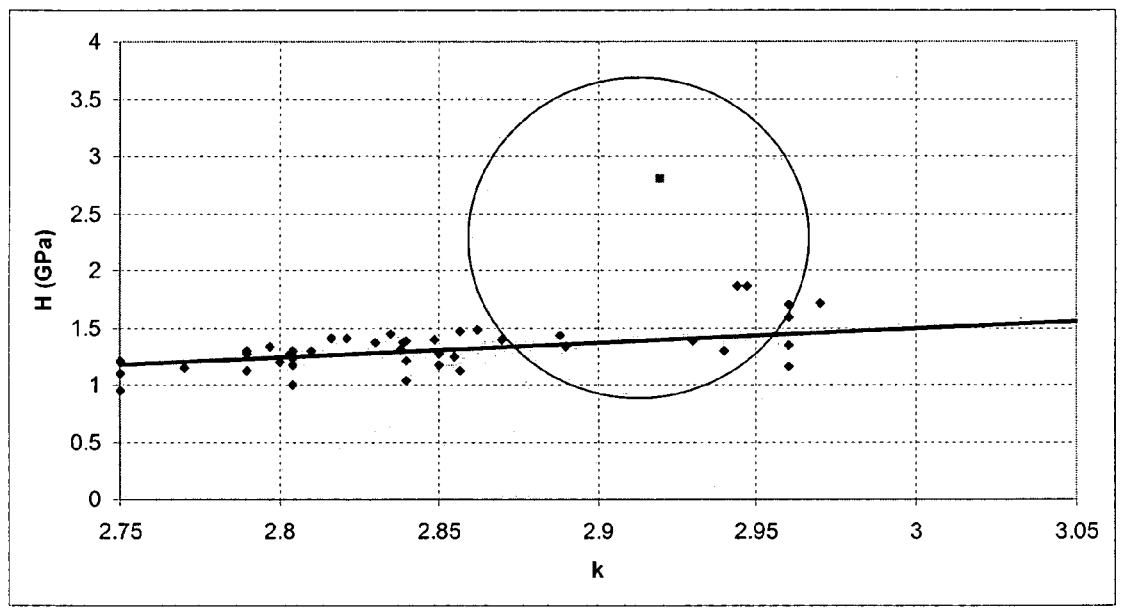
FIG. 4 is a graph comparing hardness versus dielectric for both conventionally deposited dielectric films and layered, plasma treated films prepared in accordance with an embodiment of this invention.

FIG. 4 shows a plot of hardness (H) in GPa versus dielectric constant (k) for dielectric layers produced from TMCTS and carbon dioxide using a conventional deposition process. Different deposition conditions give different results (each shown as a diamond shaped point) along a generally straight line. In the dielectric constant range of interest (e.g., about 2.8 to 3) the hardness remains below 2 GPa. However, when the dielectric layer is deposited using the layering and plasma treatment of this invention, a significant improvement in hardness is observed. See the square data point shown in FIG. 4. As shown, this layer has a dielectric constant of approximately 2.92 and a hardness of approximately 2.8 GPa.

Figure 5:
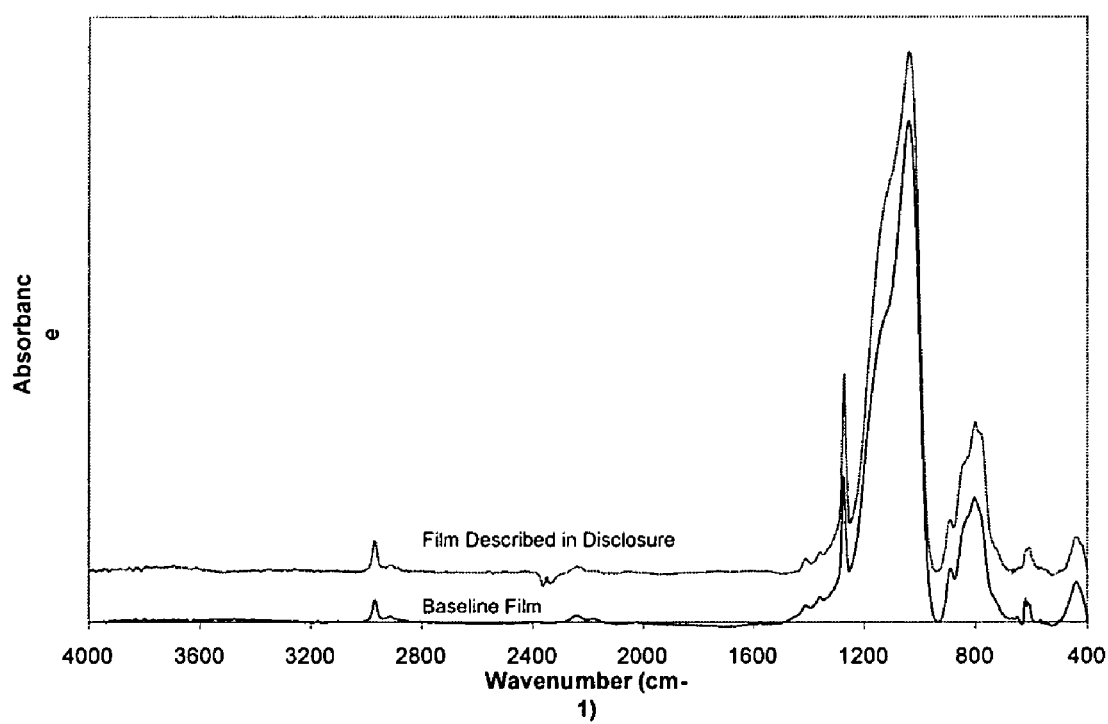
FIG. 5 presents the Fourier Transform Infra-Red (FTIR) spectra comparing the bond composition of a conventionally deposited dielectric film and a layered, plasma treated film prepared in accordance with an embodiment of this invention.

FIG. 5 presents the FTIR spectra comparing the bond composition of a conventionally deposited dielectric film and a layered, plasma treated film prepared in accordance with an embodiment of this invention. The top spectrum line corresponds to the plasma treated film, while the bottom line corresponds to the untreated film. It is clear from the figure that while the plasma treated film and the untreated film have similar bonding, the plasma treatment did produce some bond reconstruction. Points of interest on the FT-IR spectrum include a small decrease in the size of the peak corresponding to the Si—H bond at about 2300 $cm^{-1}$, a small increase in the Si—$CH_3$ peak at about 1275 $cm^{-1}$, and a small change in the left shoulder of the peak at about 1200 $cm^{-1}$ possibly corresponding to an increase in a "caged" component of the Si—O superstructure.

Figure 6A:
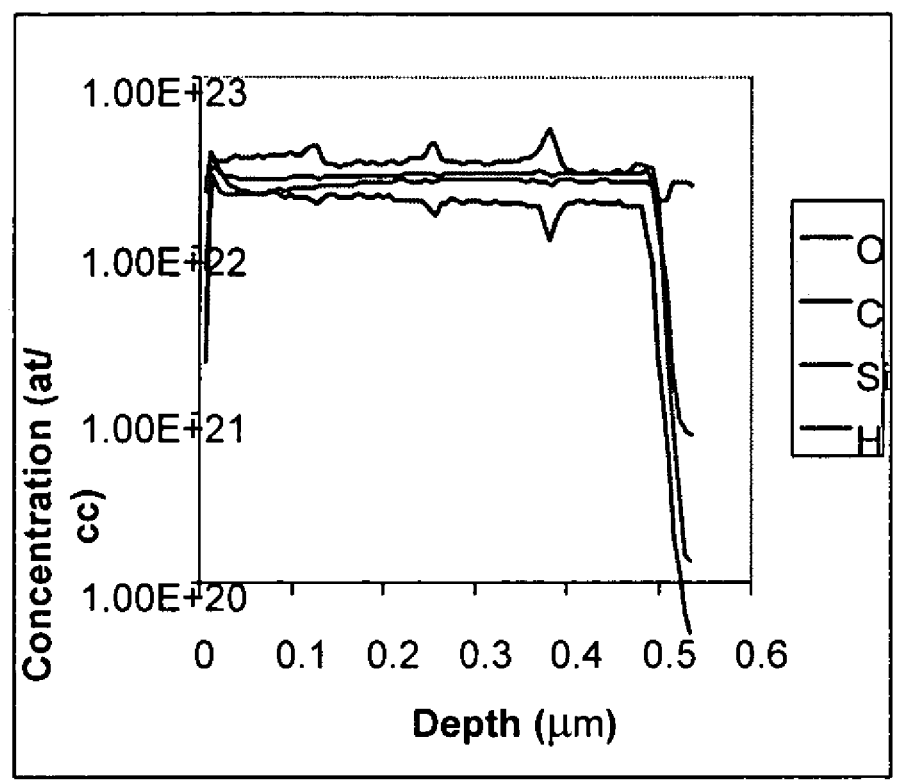
FIGS. 6a and 6b are Secondary Ion Mass Spectroscopy (SIMS) profiles presenting the atomic compositions of a conventionally deposited dielectric film and a layered, plasma treated film prepared in accordance with an embodiment of this invention.
Figure 6B:
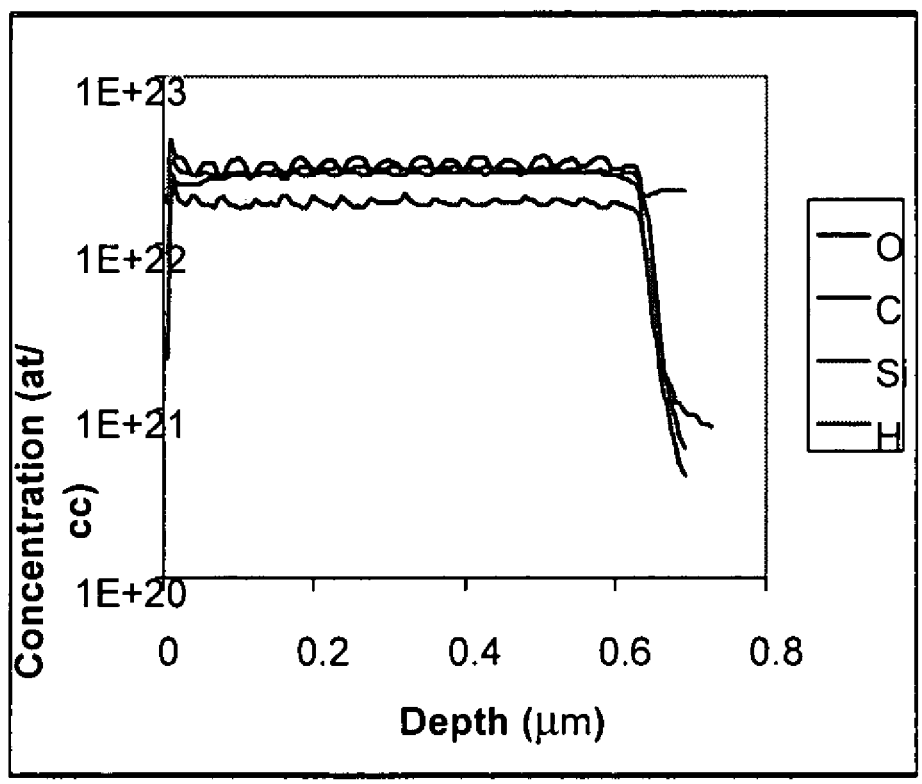

FIGS. 6a and 6b are film depth SIMS profiles presenting the atomic compositions of a conventionally deposited dielectric film and a layered, plasma treated film prepared in accordance with an embodiment of this invention. Graphs are presented for O, C, Si, and H. These figures demonstrate that the plasma treatment does not appreciably change the overall elemental concentration in the film. The graphs in FIG. 6b display notches on the concentration graphs corresponding to the boundaries of each sub-layer, which, as each sub-layer is made smaller, become less prominent, rendering the film composition more uniform.

While this invention has been described in terms of several embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and substitute equivalents as fall within the true spirit and scope of the present invention. The use of the singular in the claims does not mean "only one," but rather "one or more," unless otherwise stated in the claims.

What is claimed is:

1. A method of forming a dielectric layer having a low dielectric constant and high mechanical strength, the method comprising:
   (a) depositing a first sub-layer of the dielectric material on a substrate;
   (b) treating the sub-layer with a plasma in a manner that improves the mechanical strength of the dielectric layer;
   (c) depositing an additional sub-layer of the dielectric material on the previous sub-layer which was plasma treated; and
   (d) plasma treating the additional sub-layer in a manner that improves the mechanical strength of the dielectric layer; wherein each of (a) through (d) uses a plasma and is performed in a single reaction chamber and wherein the plasma used for operations (a)-(d) is ignited at the beginning of the process defined by operations (a)-(d) and maintained during the entire process.

2. The method of claim 1, further comprising repeating (c) and (d) one or more times until the dielectric layer attains a desired thickness.

3. The method of claim 1, wherein the as-deposited dielectric layer has a modulus of at least about 0.5-60 GPa.

4. The method of claim 1, wherein the as-deposited dielectric layer has a modulus of at least about 2-18 GPa.

5. The method of claim 1, wherein the plasma-treated dielectric layer has a modulus of at least about 3 GPa.

6. The method of claim 1, wherein the plasma-treated dielectric layer has a modulus of at least about 3 to 30 GPa.

7. The method of claim 1, wherein the as-deposited dielectric layer has a cracking threshold of at least about 1 micrometer.

8. The method of claim 1, wherein the plasma treated dielectric layer has a cracking threshold of at least about 1.5 micrometers.

9. The method of claim 1, wherein the as-deposited dielectric layer has a dielectric constant of at most about 4.

10. The method of claim 1, wherein the plasma treated dielectric layer has a dielectric constant of at most about 2.2-3.

11. The method of claim 1, wherein the dielectric layer has a hardness of at least about 2.5 GPa and a dielectric constant of at most about 3.

12. The method of claim 1, wherein the dielectric layer comprises a carbon doped silicon oxide.

13. The method of claim 1, wherein the dielectric layer comprises a fluorine doped silicon oxide.

14. The method of claim 1, wherein the thickness of the first sub-layer is between 10-10000 Angstrom.

15. The method of claim 1, wherein the thickness of the first sublayer is between 20 and 500 angstroms.

16. The method of claim 1, wherein each sub-layer thickness is between 10-10000 Angstroms.

17. The method of claim 1, wherein the thickness of each sublayer is between 20 and 500 angstroms.

18. The method of claim 1, wherein the wafer is held in one place during successive deposition and plasma treatment phases.

19. The method of claim 1, wherein transitioning between (a) and (b) comprises halting the flow of a dielectric precursor gas, but otherwise maintaining substantially the same plasma conditions and wherein the only difference between the gas flow in (a) and (b) is the presence or absence of the dielectric precursor gas.

20. The method of claim 1, wherein depositing each sub-layer comprises a process selected from the group consisting of chemical vapor deposition (CVD), atomic layer deposition (ALD), high density plasma chemical vapor deposition (HDP CVD), and plasma assisted chemical vapor deposition (PECVD).

21. The method of claim 1, wherein at least one of (b) or (d) comprises using a plasma of one or more of the following gases: $H_2$, He, Ar, O2, $CO_2$, $N_2$, and a fluorine containing gas.

22. The method of claim 1, wherein treating the sub-layer with a plasma is performed at a pressure of between about 0.1 and 20 Torr.

23. The method of claim 22, wherein treating the sub-layer with a plasma comprises generating the plasma at a frequency between about 200 kHz and 14 MHz.

24. The method of claim 22, wherein treating the sub-layer with a plasma comprises generating the plasma with more than 1 frequency wherein at least one of the frequencies is the range of about 200 kHz to 14 MHz.

25. The method of claim 1, wherein treating the sub-layer with a plasma comprises applying a plasma generating power of between about 1 and 5000 Watts.

26. The method of claim 1, wherein treating the sub-layer with a plasma comprises delivering one or more of $H_2$, He, Ar, O2, $CO_2$, $N_2$, and a fluorine containing gas at a flow rate of between about 10 and 40000 sccm each.

27. The method of claim 1, wherein transitioning between (b) and (c) comprises increasing a flow of a dielectric precursor gas while maintaining a plasma.

28. The method of claim 1 wherein at least one of the plasmas used in operations (a)-(d) is a fluorine-containing plasma.

* * * * *